United States Patent
Lee et al.

(10) Patent No.: US 12,056,825 B2
(45) Date of Patent: Aug. 6, 2024

(54) ELECTRONIC DEVICE FOR PROVIDING INDOOR POSITIONING AND METHOD THEREFOR

(71) Applicant: Samsung Electronics Co., Ltd., Suwon-si (KR)

(72) Inventors: Hyeonggeon Lee, Suwon-si (KR); Taeyoon Kim, Suwon-si (KR); Youngpo Lee, Suwon-si (KR); Dukhyun Chang, Suwon-si (KR); Hyoungjoo Lee, Suwon-si (KR); Chaeman Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 135 days.

(21) Appl. No.: 17/846,500

(22) Filed: Jun. 22, 2022

(65) Prior Publication Data

US 2022/0319118 A1     Oct. 6, 2022

Related U.S. Application Data

(63) Continuation of application No. PCT/KR2020/017862, filed on Dec. 8, 2020.

(30) Foreign Application Priority Data

Dec. 24, 2019   (KR) .................. 10-2019-0173683

(51) Int. Cl.
   *G06T 19/00*      (2011.01)
   *G01R 33/00*     (2006.01)

(52) U.S. Cl.
   CPC ........ *G06T 19/003* (2013.01); *G01R 33/0029* (2013.01); *G01R 33/0064* (2013.01); *G06T 19/006* (2013.01)

(58) Field of Classification Search
   CPC ..................... G06T 19/003; G06T 19/006
   See application file for complete search history.

(56) References Cited

U.S. PATENT DOCUMENTS

| | | | |
|---|---|---|---|
| 9,989,624 B2 | 6/2018 | Ryan et al. | |
| 2012/0143495 A1 | 6/2012 | Dantu | |

(Continued)

FOREIGN PATENT DOCUMENTS

| | | | | |
|---|---|---|---|---|
| CN | 107037403 A | * | 8/2017 | ............... G01S 5/16 |
| CN | 107037403 A | | 8/2017 | |

(Continued)

OTHER PUBLICATIONS

Kalyan Pathapati Subbu et al., LocateMe: Magnetic-Fields-Based Indoor Localization Using Smartphones, ACM Transactions on Intelligent Systems and Technology, Sep. 2013.

(Continued)

*Primary Examiner* — Samantha (Yuehan) Wang
(74) *Attorney, Agent, or Firm* — Jefferson IP Law, LLP

(57) ABSTRACT

An electronic device is provided. The electronic device includes a display, a camera, and a processor operatively connected to the display and the camera. The processor may display an augmented reality on the display on the basis of an image captured by the camera, may display a point on the display so as to move on the augmented reality while interworking with the movement of the electronic device, may recognize a selected spot on the augmented reality, may display a guide area on the augmented reality, the guide area including the selected spot such that the point moves within a specific area, may store sensor information including a geomagnetic value measured while the point moves within the guide area, may store radio signal intensity information (Continued)

measured while the point moves within the guide area, and may correct a geomagnetic value included in the sensor information.

20 Claims, 14 Drawing Sheets

(56) References Cited

U.S. PATENT DOCUMENTS

| | | | |
|---|---|---|---|
| 2013/0177208 A1 | 7/2013 | Haverinen | |
| 2013/0179075 A1 | 7/2013 | Haverinen | |
| 2014/0286534 A1 | 9/2014 | Haverinen | |
| 2014/0315570 A1* | 10/2014 | Yun | G01S 5/0264 455/456.1 |
| 2015/0257119 A1 | 9/2015 | Hahm et al. | |
| 2015/0260523 A1 | 9/2015 | Haverinen | |
| 2015/0319580 A1 | 11/2015 | Kim et al. | |
| 2016/0003625 A1 | 1/2016 | Haverinen | |
| 2016/0116290 A1 | 4/2016 | Haverinen et al. | |
| 2017/0180948 A1 | 6/2017 | Haverinen et al. | |
| 2017/0336511 A1 | 11/2017 | Nerurkar et al. | |
| 2019/0049231 A1 | 2/2019 | Choi et al. | |

FOREIGN PATENT DOCUMENTS

| | | | |
|---|---|---|---|
| EP | 2 615 420 A2 | 7/2013 | |
| EP | 2615420 A2 * | 7/2013 | ............. G01C 17/02 |
| KR | 10-2015-0125533 A | 11/2015 | |
| KR | 10-2017-0084896 A | 7/2017 | |
| KR | 10-2017-0100423 A | 9/2017 | |
| KR | 10-2019-0038009 A | 4/2019 | |
| KR | 10-2019-0098472 A | 8/2019 | |
| KR | 10-2019-0110859 A | 10/2019 | |

OTHER PUBLICATIONS

Namkyoung Lee et al., AMID: Accurate Magnetic Indoor Localization Using Deep Learning, sensors, Mar. 28, 2018.
Extended European Search Report dated Dec. 5, 2022, issued in European Patent Application No. 20906880.8-1206.

* cited by examiner

FIG. 8A
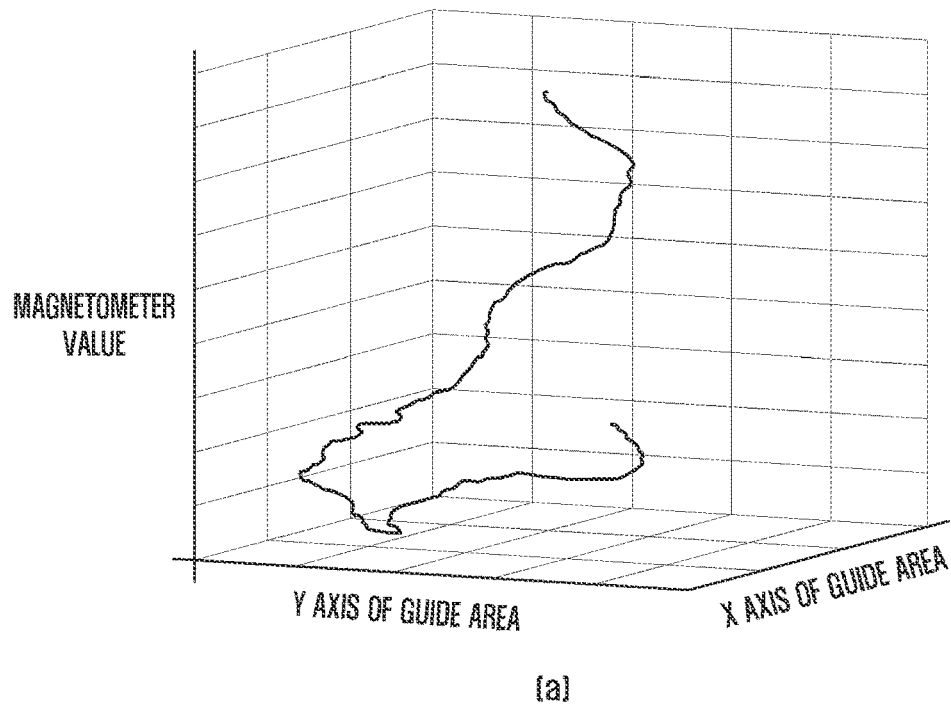
(a)
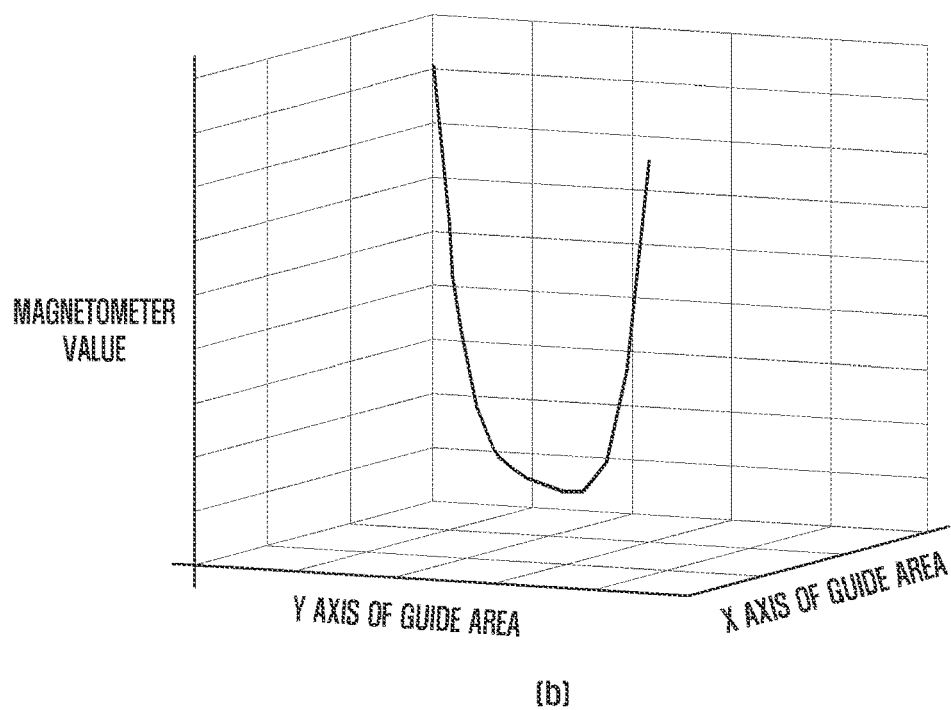
(b)

ELECTRONIC DEVICE FOR PROVIDING INDOOR POSITIONING AND METHOD THEREFOR

CROSS-REFERENCE TO RELATED APPLICATION(S)

This application is a continuation application, claiming priority under § 365(c), of an International application No. PCT/KR2020/017862, filed on Dec. 8, 2020, which is based on and claims the benefit of a Korean patent application number 10-2019-0173683, filed on Dec. 24, 2019, in the Korean Intellectual Property Office, the disclosure of which is incorporated by reference herein in its entirety.

BACKGROUND

1. Field

The disclosure relates to a method and an electronic device for generating a virtual marker which may be used for indoor positioning.

2. Description of Related Art

An indoor positioning service may collectively refer to identifying a user's position inside a building or structure and providing a service based on the position. Existing indoor positioning services may include tracking positions of a terminal and a user and, more specifically, may include a geofencing service of determining whether to enter or exit a specific point-of-interest.

The above information is presented as background information only to assist with an understanding of the disclosure. No determination has been made, and no assertion is made, as to whether any of the above might be applicable as prior art with regard to the disclosure.

SUMMARY

A conventional indoor position service may require an indoor map, which is provided from the outside or is generated via its own algorithm, and measurement of sensor values at various points in the indoor map. In some cases, an infrastructure such as a Bluetooth beacon is required.

An indoor position service based on a wireless local area network (LAN), such as 802.11mc, is also being proposed, but again distribution of a corresponding access point (AP) should be preceded. Such pre-work and infrastructure installation required for indoor positioning is one of major difficulties in popularization of corresponding services.

In a case of geofencing, there is no need to specify coordinates, so that a service may be possible with a relatively small amount of information, but again, when high precision and accuracy are required, it is common to additionally install and utilize a dedicated infrastructure such as a Bluetooth beacon.

Aspects of the disclosure are to address at least the above-mentioned problems and/or disadvantages and to provide at least the advantages described below. Accordingly, an aspect of the disclosure is to provide a method of generating a marker which may be used for an indoor position service by using augmented reality (AR) provided through an electronic device that a user can easily carry.

Additional aspects will be set forth in part in the description which follows and, in part, will be apparent from the description, or may be learned by practice of the presented embodiments.

In accordance with an aspect of the disclosure, an electronic device is provided. The electronic device includes a display, a camera, and a processor operatively connected to the display and the camera, wherein the processor is configured to display, based on an image captured by the camera, augmented reality on the display, display a point moving in the augmented reality on the display in association with movement of the electronic device, recognize a selected spot in the augmented reality, display a guide area including the selected spot in the augmented reality so that the point moves within a specific area, store sensor information including a magnetometer value measured while the point is moving within the guide area, store radio signal intensity information measured while the point is moving within the guide area, and correct the magnetometer value included in the sensor information by using a reference direction and a direction of the electronic device at a point in time when the magnetometer value is measured.

In accordance with another aspect of the disclosure, a method for providing indoor positioning is provided. The method includes displaying a point moving in augmented reality in association with movement of an electronic device, recognizing a selected spot in the augmented reality, displaying a guide area, which includes the selected spot, in the augmented reality so that the point moves within a specific area, storing sensor information including a magnetometer value measured in a block through which the point passes while the point is moving within the guide area, storing radio signal intensity information measured while the point is moving within the guide area, and correcting the magnetometer value included in the sensor information by using a reference direction and a direction of the electronic device at a point in time when the magnetometer value is measured.

According to various embodiments disclosed in the document, a virtual marker can be easily generated using augmented reality displayed on an electronic device of a user. When the virtual marker is used, entry into or exit from a specific indoor spot can be detected with high precision of several centimeters even without additional infrastructure for indoor positioning.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 8A and 8B are diagrams for describing an operation of validating a magnetometer value according to various embodiments of the disclosure.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
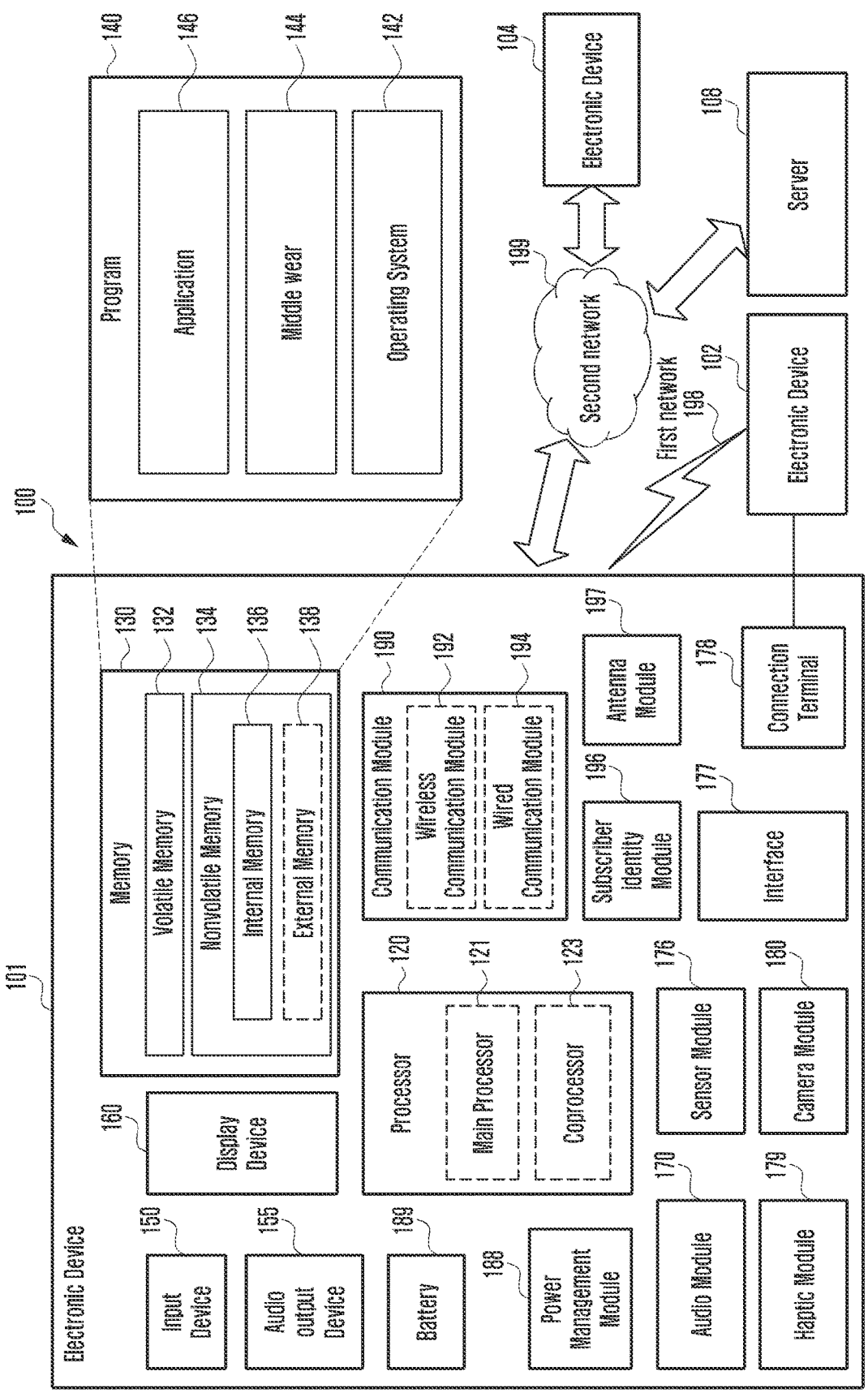
FIG. 1 is a block diagram of an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. Non-volatile memory 134 may include internal memory 136 or external memory 138.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, Wi-Fi direct, or infrared data association (IrDA)) or the second network 199 (e.g., a long-range communication network, such as a cellular network, the Internet, or a computer network (e.g., LAN or wide area network (WAN))). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., printed circuit board (PCB)). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

An electronic device mentioned hereinafter may be an electronic device including a display (e.g., the display device 160 of FIG. 1), a camera (e.g., the camera module 180 of FIG. 1), and a processor (e.g., the processor 120 of FIG. 1) operatively connected to the display and the camera. The electronic device may be, for example, the electronic device of FIG. 1. The electronic device may be a device, such as a smartphone and a tablet PC, but is not limited thereto.

Figure 2:
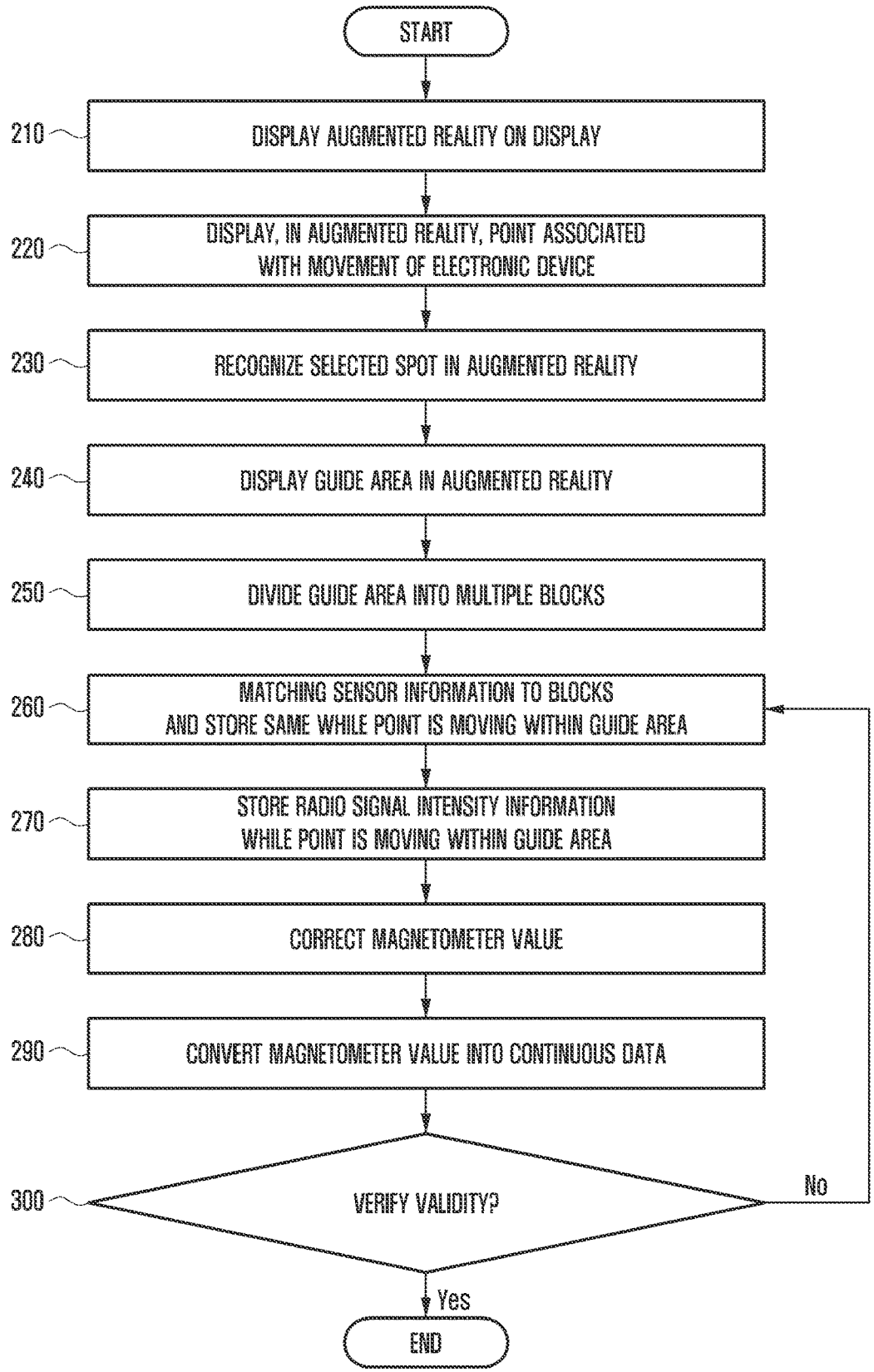
FIG. 2 is a flowchart of a method for providing indoor positioning according to an embodiment of the disclosure.

FIG. 2 is a flowchart of a method for providing indoor positioning according to an embodiment of the disclosure.

According to various embodiments, the method for providing indoor positioning disclosed in the document may be performed, for example, according to the flowchart illustrated in FIG. 2. The flowchart illustrated in FIG. 2 is only a flowchart according to an embodiment of the method for providing indoor positioning, and a sequence of respective operations may be thus changed or performed simultaneously.

According to various embodiments, operation 210 to operation 300 may be performed by a processor (e.g., the processor 120 of FIG. 1) of an electronic device (e.g., the electronic device 101 of FIG. 1) or may be performed using at least one of a wireless communication module (e.g., the wireless communication module 192 of FIG. 1) and/or a sensor module (e.g., the sensor module 176 of FIG. 1).

Referring to FIG. 2, the method for providing indoor positioning according to an embodiment may include displaying, in operation 210, augmented reality on a display of an electronic device, displaying, at operation 220, a point associated with movement of the electronic device in the augmented reality, recognizing, at operation 230, a selected spot in the augmented reality, displaying, at operation 240, a guide area in the augmented reality, dividing, at operation 250, the guide area into multiple blocks, matching sensor information to the blocks and storing, at operation 260, the same while the point is moving within the guide area, storing, at operation 270, radio signal intensity information measured while the point is moving within the guide area, correcting, at operation 280, a magnetometer value, converting, at operation 290, the magnetometer value into continuous data, and validating, in operation 300, the magnetometer value. Hereinafter, detailed contents of embodiments of each operation will be described with reference to the drawings.

Figure 3:
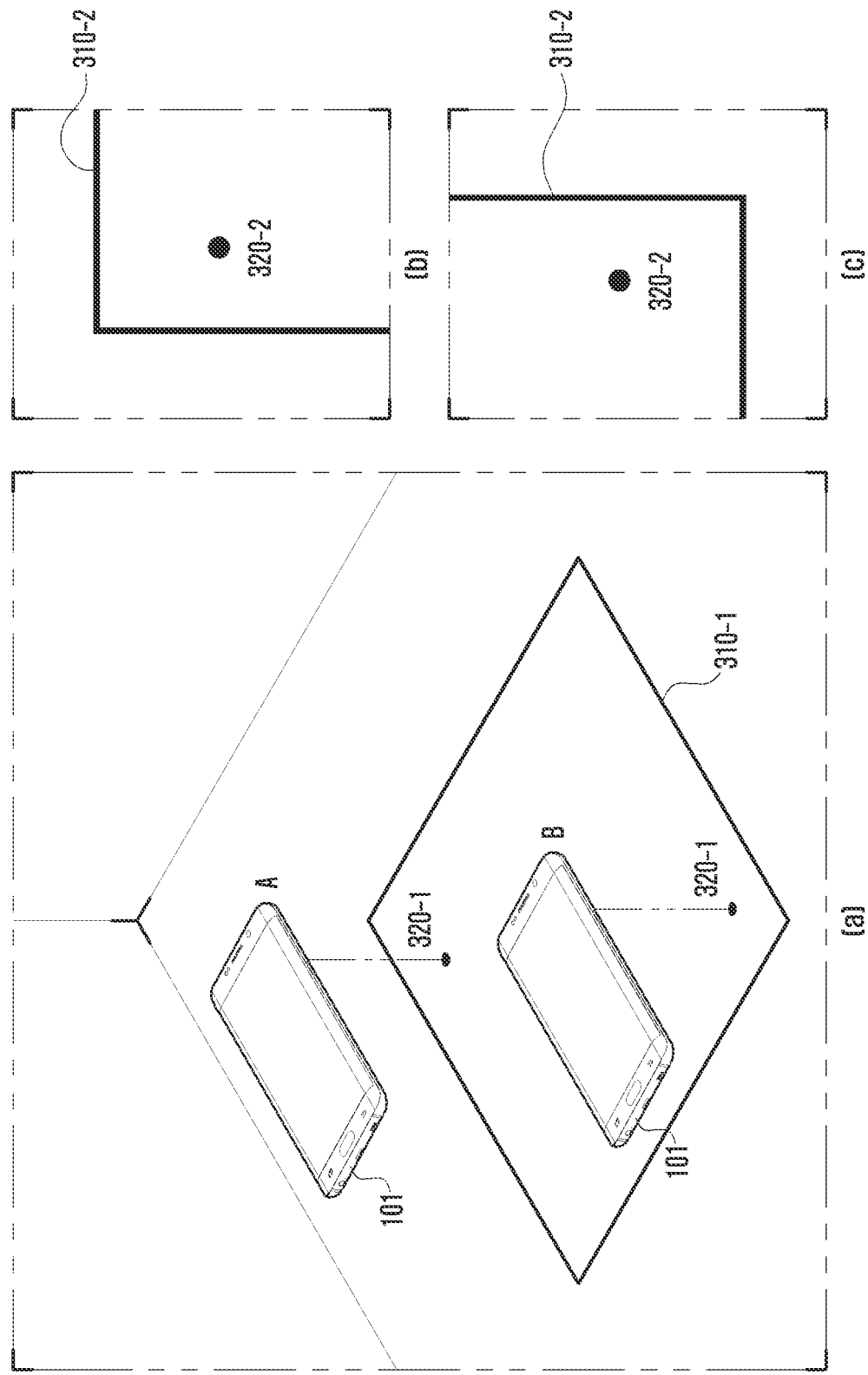
FIG. 3 is a diagram for describing augmented reality and points displayed on a display of an electronic device according to an embodiment of the disclosure.

FIG. 3 is a diagram for describing augmented reality and points displayed on a display of an electronic device according to an embodiment of the disclosure.

According to various embodiments, a processor (e.g., the processor 120 of FIG. 1) of the electronic device 101 may display (e.g., 210 of FIG. 2) augmented reality (AR) on a display (e.g., the display device 160 of FIG. 1) by using an image captured by a camera (e.g., the camera module 180 of FIG. 1) of the electronic device 101. Augmented reality may refer to a computer graphic technique of synthesizing a virtual object (e.g., things or information) to a real environment and displaying the virtual object as if the virtual object exists in the real environment.

According to various embodiments, the processor of the electronic device 101 may display (e.g., at operation 220 of FIG. 2) a point 320-2 in the augmented reality displayed on the display. The point 320-2 may move in the augmented reality in association with movement of the electronic device 101. The point 320-2 may be defined as a specific spot in the augmented reality, which corresponds to the foot (a measurement spot 320-1) of a perpendicular line dropped in a measurement area 310-1 from a specific spot (e.g., a central part of the electronic device 101 or a part in which the camera of the electronic device 101 is placed) of the electronic device 101. The measurement area 310-1 may be understood as an area in real space corresponding to a guide area 310-2 displayed in the augmented reality. A detailed description of the guide area 310-2 will be described later.

Referring to FIG. 3, if an electronic device 101 is located at spot A in part (a) of FIG. 3, a point 320-2 may be displayed on a display of the electronic device 101 as shown in part (b) of FIG. 3. If the electronic device 101 is located at spot B in part (a) of FIG. 3, the point 320-2 may be displayed on the display of the electronic device 101 as shown in part (c) of FIG. 3. The point 320-2 may be displayed in a shape such as a dot. The shape and color of the point 320-2 may be changed according to an object displayed around the point 320-2.

Figure 4:
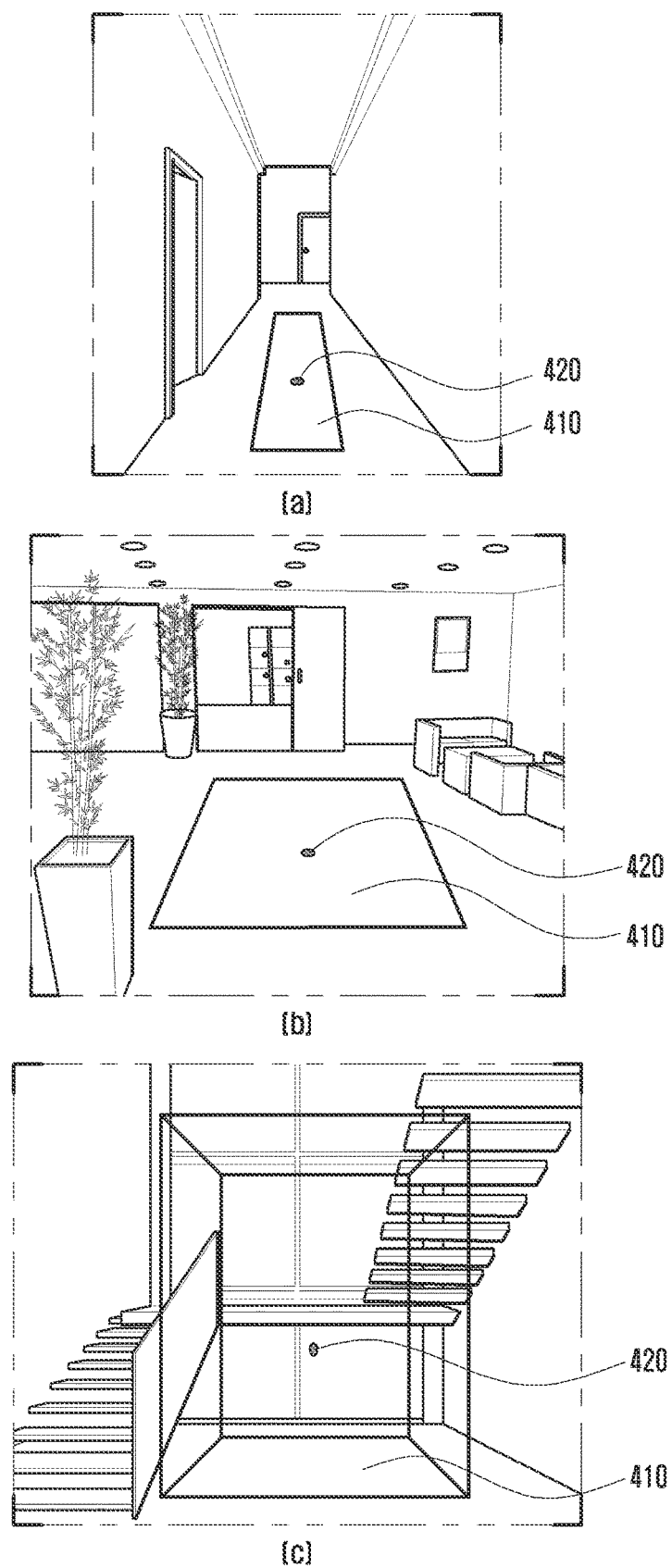
FIG. 4 is a diagram for describing a guide area according to an embodiment of the disclosure.

FIG. 4 is a diagram for describing a guide area according to an embodiment of the disclosure.

According to various embodiments, a processor (e.g., the processor 120 of FIG. 1) of an electronic device (e.g., the electronic device 101 of FIG. 1) may display (e.g., at operation 240 of FIG. 2) a guide area 410 in augmented reality. The guide area 410 may refer to an area displayed in the augmented reality. For example, the guide area 410 may be an area in the augmented reality, which corresponds to a real area (e.g., the measurement area 310-1 in FIG. 3) in which a virtual marker for indoor positioning is to be generated. The guide area 410 may be displayed in various forms. For example, as shown in part (a) of FIG. 4, the guide area 410 may be displayed as a rectangular area. For example, as shown in part (b) of FIG. 4, the guide area 410 may be displayed as a square area. For example, as shown in part (c) of FIG. 4, the guide area 410 may be displayed as a hexahedral area.

According to various embodiments, the boundary of the guide area 410 may be displayed so as to be distinguished from surrounding objects. For example, as illustrated in FIG. 4, the boundary of the guide area 410 may be indicated by a line. In addition, the guide area 410 may be displayed in various shapes which may be distinguished from other objects in the augmented reality. For example, a size and a color of the guide area 410 may be changed according to an object displayed around the guide area 410.

According to various embodiments, the guide area 410 may be provided based on an input of a user. The processor of the electronic device may recognize (e.g., at operation 230 in FIG. 2) a specific spot 420 selected by the user in the augmented reality. For example, the user may select the specific spot 420 in the augmented reality via a display of the electronic device. The user may select the specific spot 420 in the augmented reality by one-point touching of the specific spot 420. If the user selects the specific spot 420, the guide area 410 including the specific spot 420 may be displayed in the augmented reality. For example, the selected specific spot 420 of the user may be configured as the center of the guide area 410, and the guide area 410 may be displayed according to a preconfigured size of the guide area 410. The user may designate a specific spot in the augmented reality by a drag method. In this case, the guide area 410 may include the selected spot dragged by the user. The selected spot dragged by the user may be provided, as it is, as the guide area 410, and an area including the selected spot dragged by the user may be provided as the guide area 410.

If the guide area 410 is designated as described above, the processor may recognize a part, in which the guide area 410 in the augmented reality is displayed, via coordinates of the augmented reality. For example, the processor may recognize the guide area 410 via the coordinates of the augmented reality, based on the selected spot of the user. The processor of the electronic device may relatively recognize a position of an object in the augmented reality. Accordingly, the processor may recognize augmented reality coordinates of the object displayed in the augmented reality, based on a specific spot.

Figure 5A:
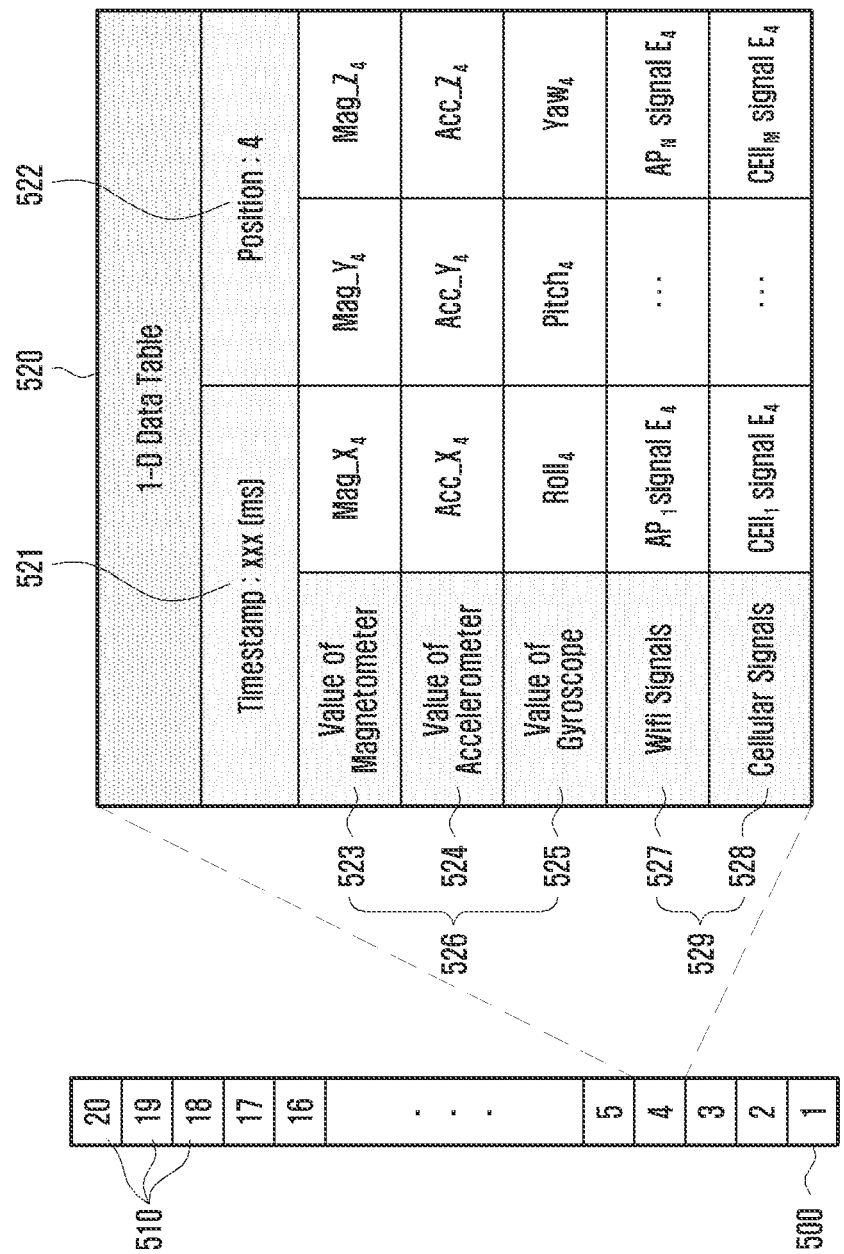
FIGS. 5A, 5B, and 5C are diagrams for describing information corresponding to multiple blocks of a guide area according to various embodiments of the disclosure.
Figure 5B:
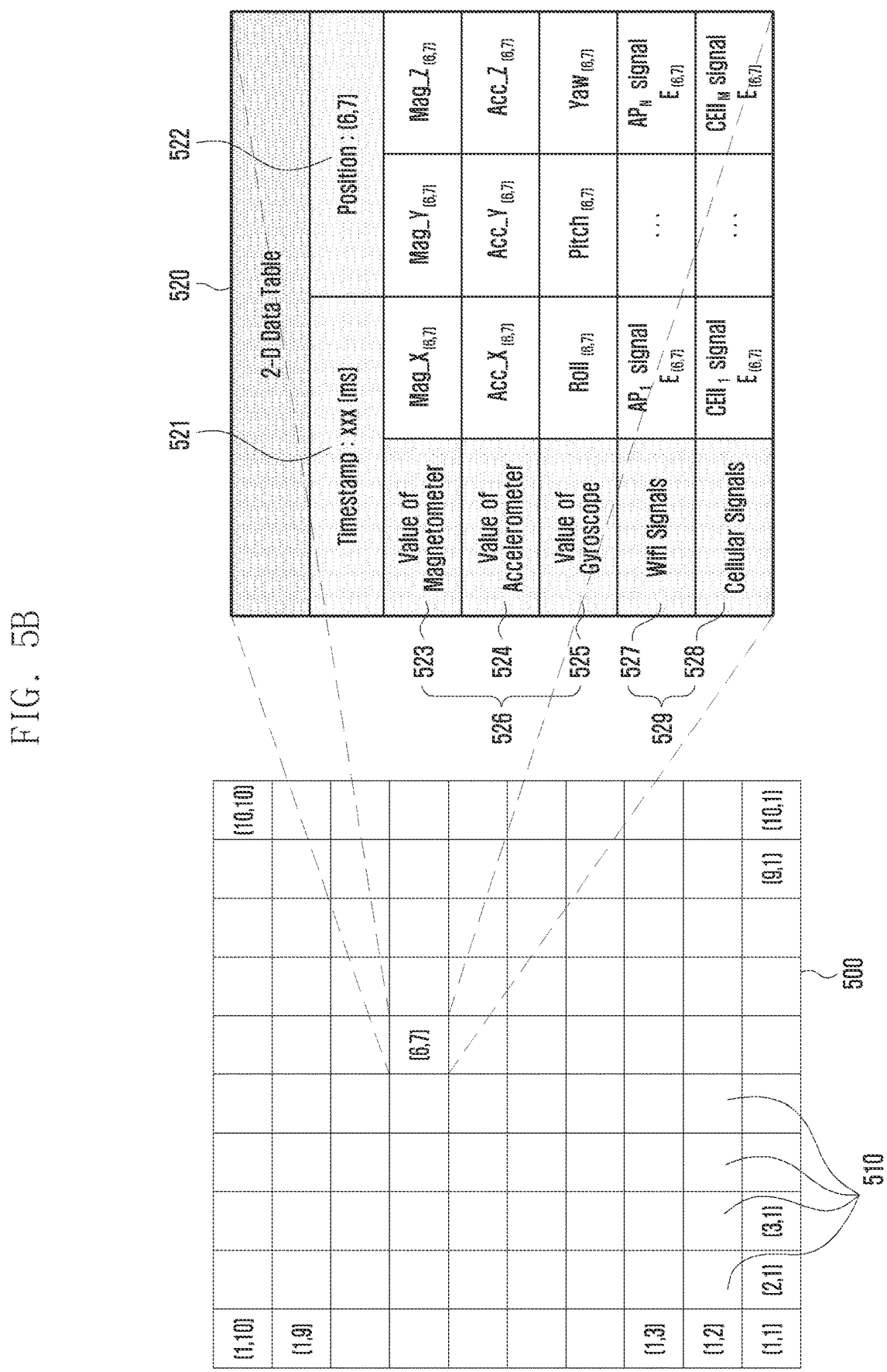
Figure 5C:
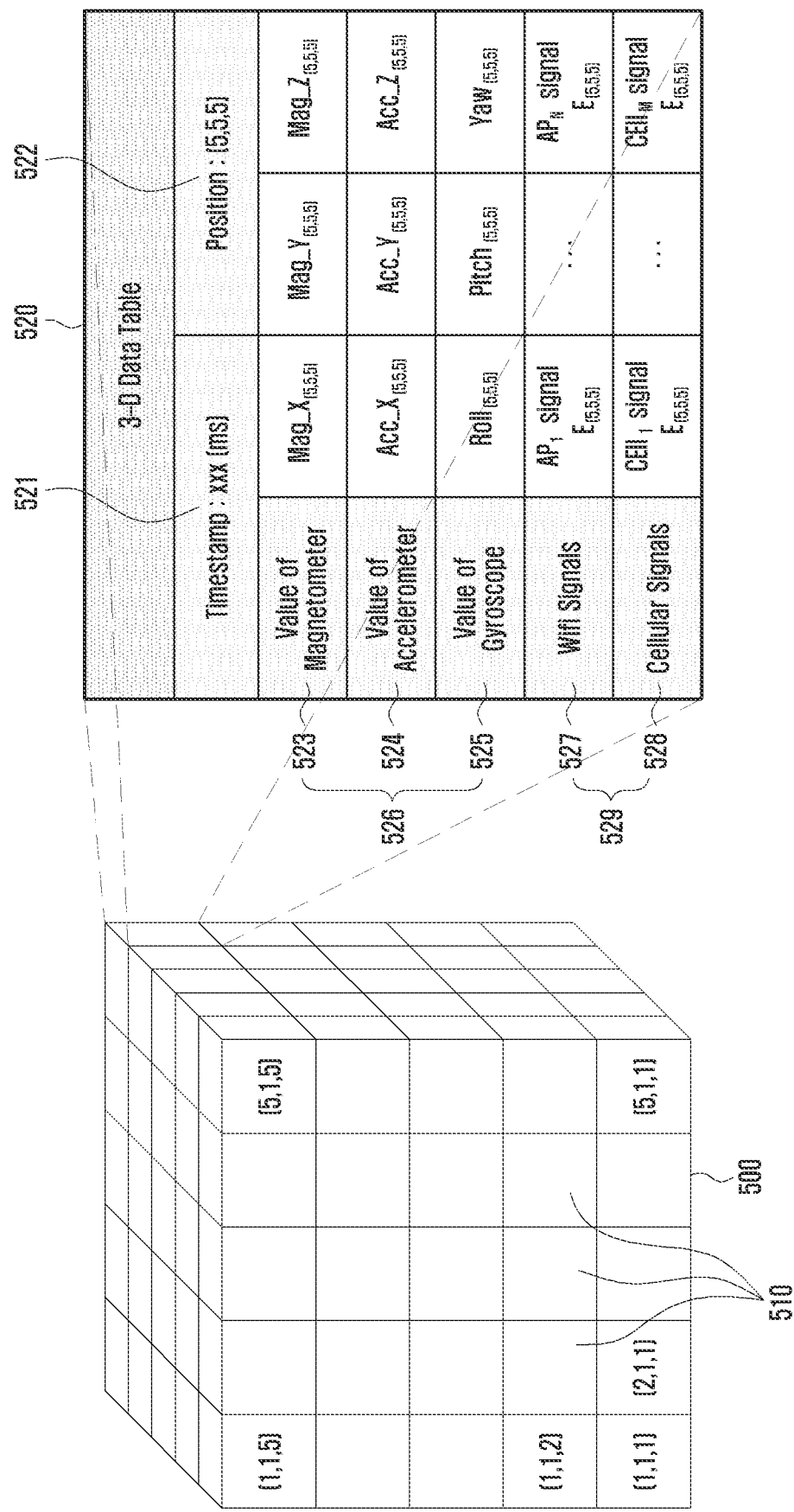

FIGS. 5A, 5B, and 5C are diagrams for describing information corresponding to multiple blocks of a guide area according to various embodiments of the disclosure.

Figure 5D:
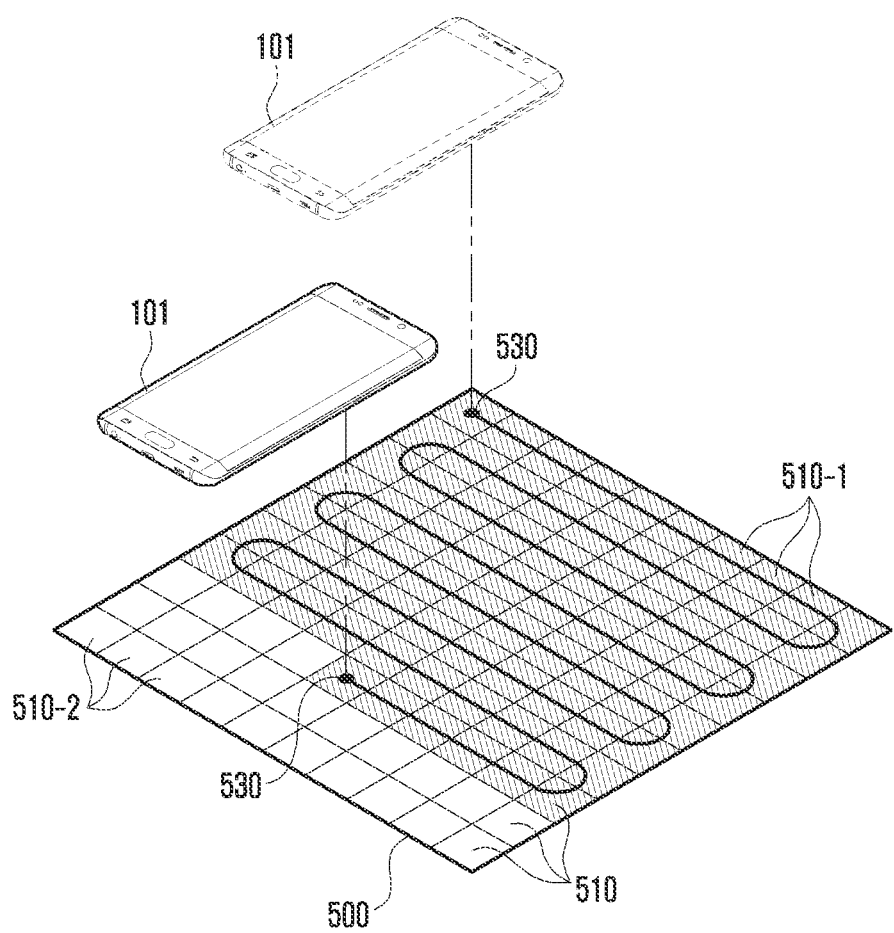
FIG. 5D is a diagram for describing a point passing through multiple blocks according to an embodiment of the disclosure.

FIG. 5D is a diagram for describing a point passing through multiple blocks according to an embodiment of the disclosure.

According to various embodiments, a processor (e.g., the processor 120 of FIG. 1) of an electronic device (e.g., the electronic device 101 of FIG. 1) may divide (e.g., at operation 250 of FIG. 2) a displayed guide area 500 into multiple blocks 510. According to various embodiments, as illustrated in FIGS. 5A to 5C, the processor of the electronic device may divide the displayed guide area 500 into the multiple blocks 510 so as to display the same on a display (e.g., the display device 160 of FIG. 1). The guide area 500 may be divided into the preconfigured number of blocks of multiple blocks 510. For example, as illustrated in FIG. 5B, when an area of the guide area 500 displayed in two dimensions is 1 m², if an area of one block of multiple blocks 510 is configured to 100 cm², the guide area 500 may be divided into 10×10 blocks of multiple blocks 510. In addition, the number of blocks of multiple blocks 510 may be variously changed. The processor may recognize the guide area 500 via coordinates of augmented reality, and therefore may also recognize coordinates of the multiple blocks 510 included in the guide area 500. Referring to FIGS. 5A to 5C, the figures depict a guide area 500 divided into the multiple blocks 510 which are visually displayed, but the multiple blocks 510 may not be displayed in the guide area 500.

According to various embodiments, as illustrated in FIG. 5D, a user may move while holding the electronic device 101 so that a point 530 may move within the guide area 500. Referring to FIG. 5D, an electronic device 101 is separately illustrated over a guide area 500 in order to describe that the electronic device 101 moves in a real space corresponding to the guide area 500, but the guide area 500 and a point 530 may be displayed in an augmented reality displayed on the display of the electronic device 101.

The guide area 500 and the point 530 displayed on the display may induce the user to move the point 530 within the guide area 500. The user may move the electronic device 101 so that the point 530 does not deviate from the guide area 500, by identifying a position of the point 530 within the guide area 500. According to various embodiments, the electronic device 101 may induce moving of the point 530 within the guide area 500, by displaying, using a line, a path along which the point 530 moves. According to various embodiments, the processor may identify the position of the point 530 with respect to the guide area 500 so as to display a direction (e.g., forwarding or rotating) in which the point 530 is to move, on the display via text or a user interface (UI) such as an arrow, or may indicate, using voice, the direction in which the point 530 is to move. According to various embodiments, the processor may identify posture of the electronic device in real time via a sensor included in the electronic device 101. The processor may display, on the display, the direction of the electronic device 101 with respect to the guide area 500 via text or the UI, such as an arrow, or may indicate the posture of the electronic device 101 via voice so that the guide area 500 and the electronic device 101 are maintained in a parallel state.

According to various embodiments, while the point 530 is moving in the guide area 500, the processor may generate a data table 520 and store the same in a memory (e.g., the memory 130 of FIG. 1) of the electronic device 101. The data table 520 may include information corresponding to the multiple blocks 510. For example, the data table 520 may include identification numbers 522 of the multiple blocks 510, points in time (timestamp 521) at which the point 530 passes through the multiple blocks 510, sensor information 526 including a magnetometer value 523 measured by a magnetometer, and radio signal intensity information 529. According to various embodiments, the data table 520 may further include coordinate information of the multiple blocks 510.

According to various embodiments, the processor may compare coordinates of the multiple blocks 510 with coordinate information of spots through which the point 530 passes, so as to identify a block, through which the point 530 is passing, from among the multiple blocks 510 in the guide area 500. The processor may store (e.g., at operation 260 of FIG. 2) a magnetometer value measured while the point 530 is moving within a specific block, and may calculate a representative value (e.g., Mag_$X_4$, Mag_$Y_4$, and Mag_$Z_4$ of FIG. 5A) for a three-axis direction of the stored magnetometer value. The magnetometer value may be a measured value obtained by a magnetometer sensor of the electronic device. The magnetometer sensor may be a sensor which outputs, as an intensity, a magnetometer value of X, Y, and Z axes of the electronic device with respect to magnetic north. According to various embodiments, the processor may determine a median or an average value of magnetometer values obtained while the point 530 is moving within the specific block, as a representative value of the magnetometer values of the multiple blocks 510. In addition, the processor may determine the representative value of the magnetometer values obtained while moving within the multiple blocks 510, by using various methods of calculating a representative value. The processor may store the representative value of the magnetometer values, which is determined by the above method, in the data table 520 of a corresponding block. In addition, other values (e.g., values 524 measured by the acceleration sensor, values 525 measured by the gyro sensor, and radio signal intensity information 529) stored in the data table 520 may also be stored as representative values of values measured while moving in the multiple blocks 510.

According to various embodiments, when the point passes a specific block, the processor may store (e.g., at operation 270 of FIG. 2) the radio signal intensity information 529 in the data table 520 of the corresponding block. In one embodiment, a radio signal may correspond to an intensity value of a signal, which is obtained by measuring a signal via a wireless communication module (e.g., the wireless communication module 192 of FIG. 1), the signal being according to at least one communication network of a first network (e.g., a short-range communication network such as Bluetooth, Wi-Fi, or infrared data association (IrDA)) or a second network (e.g., a telecommunication network, such as a cellular network). For example, as illustrated in FIGS. 5A to 5C, a Wi-Fi signal intensity 527 and a cellular signal intensity 528 may be stored in the data table 520. Such radio signal intensity information 529 may be stored in a data table matched to at least one block among the multiple blocks 510 within the guide area 500. For example, the radio signal intensity information 529 may be stored only in a data table corresponding to one block among the multiple blocks 510 within the guide area 500. For example, the radio signal intensity information 529 may be stored in a data table corresponding to a block through which the point 530 first passes. According to various embodiments, if radio signals are transmitted or received by multiple repeaters, the radio signal intensity information 529 of the respective repeaters may be distinguished and stored.

According to various embodiments, the processor may add, to the sensor information 526, values measured by the acceleration sensor and the gyro sensor of the electronic device while the point 530 is moving within the guide area 500 so as to store the values in the data table 520. For example, an acceleration value of values 524 and a gyro value of values 525 may be stored in the data table 520.

According to various embodiments, as illustrated in FIG. 5D, the processor may display a block 510-1, which has been measured, differently from a block 510-2 which needs to be measured so that the point 530 is able to continuously move within the guide area 500. For example, the block 510-1 which has been measured may be displayed in green shade, and the block 510-2 which needs to be measured may not be shaded. The user may distinguish and recognize the block 510-1 which has been measured and the block 510-2 which needs to be measured, and therefore the user may move the electronic device so that the point is placed in the block 510-2 which needs to be measured. In this way, information including the magnetometer value may be measured in all blocks of multiple blocks 510 in the guide area 500. According to various embodiments, the point 530 moves within the guide area 500, and a measurement completed path may be displayed using a line to indicate a measurement completed area (or path) within the guide area 500.

According to various embodiments, dividing of the guide area 500 into the multiple blocks 510 may be performed after the user sufficiently moves the point within the guide area 500. In this case, the number of the multiple blocks 510 may be determined according to a speed at which the user moves the point within the guide area 500. The guide area 500 may include many blocks of multiple blocks 510 as the user moves the point slowly within the guide area 500. In order for the user to move the point at an appropriate speed within the guide area 500, the processor may indicate, on the display, that a moving speed of the point is fast or slow. In this case, the sensor information 526 and the radio signal intensity information 529 which are measured before division of the multiple blocks 510 may be stored in the data table 520 corresponding to each of the divided blocks of multiple blocks 510.

According to various embodiments, if a magnetometer value measured in the block of multiple blocks 510 according to the moving speed of the point 530 is not sufficient, the corresponding block may be displayed differently from a block which has been normally measured, so as to allow the user to identify a block which has not been measured.

Figure 6A:
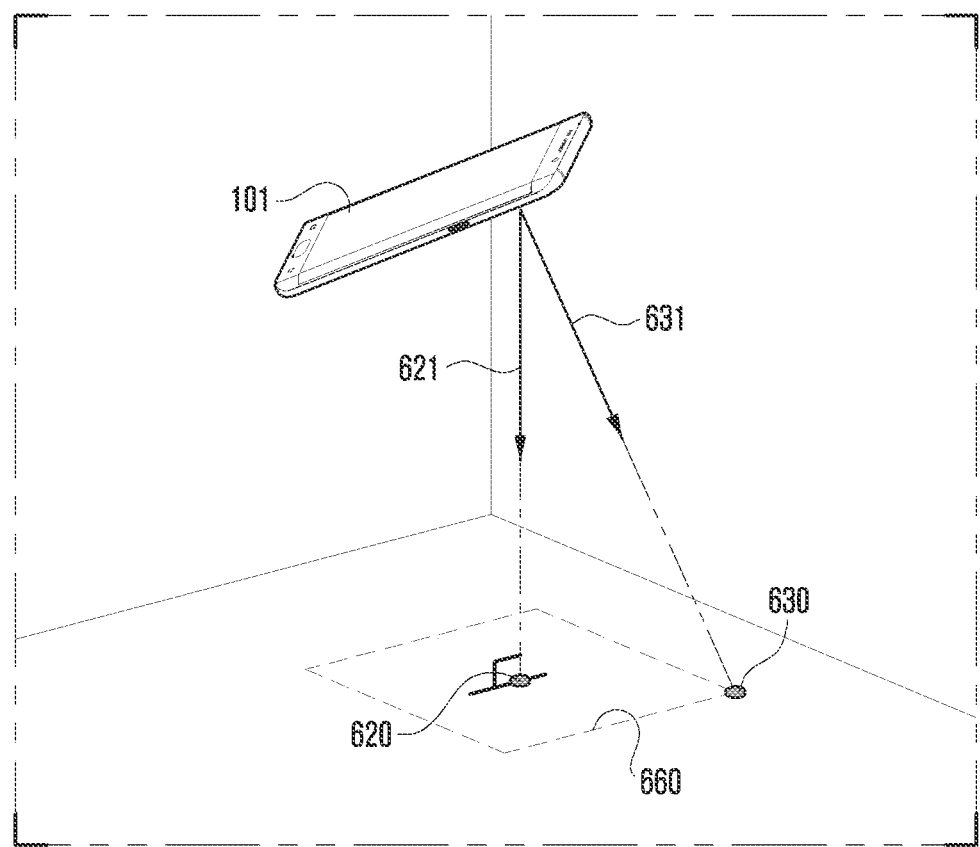
FIGS. 6A and 6B are diagrams for describing a method for correcting a magnetometer value according to various embodiments of the disclosure.
Figure 6B:
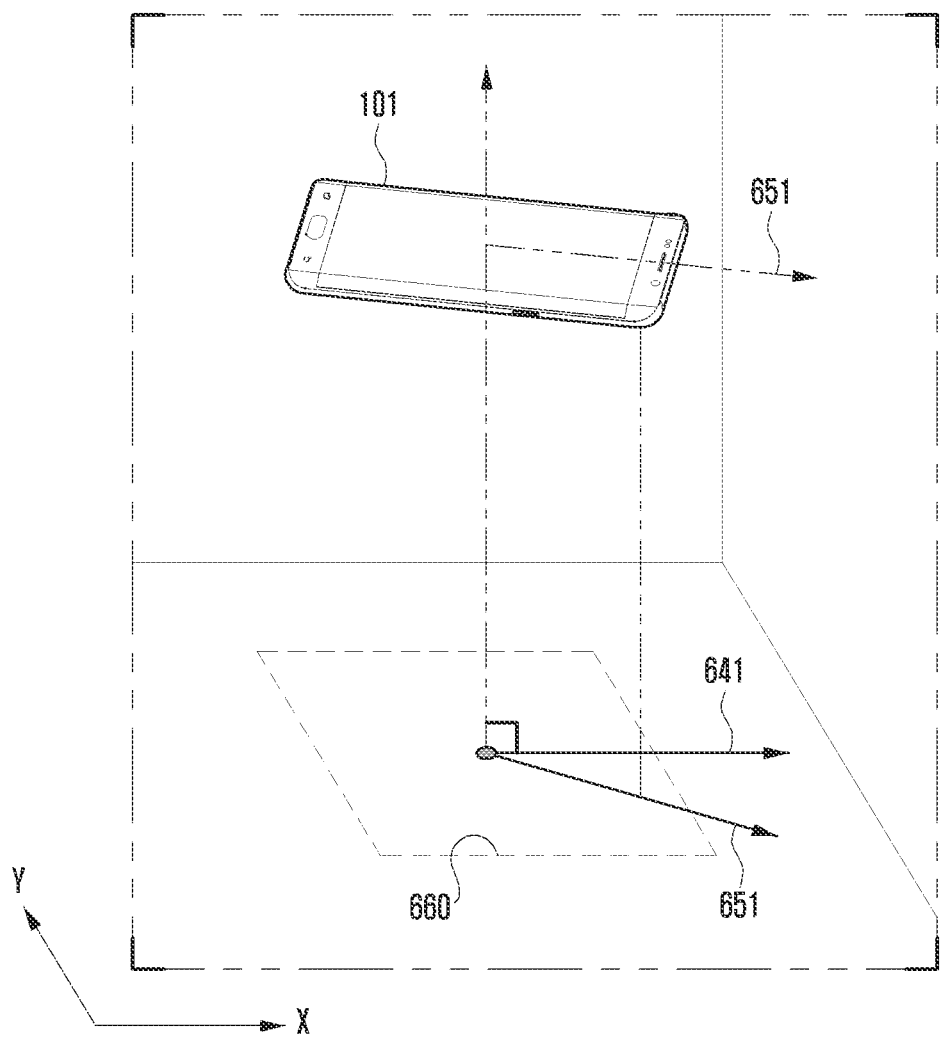

FIGS. 6A and 6B are diagrams for describing a method for correcting a magnetometer value according to various embodiments of the disclosure.

According to various embodiments, a processor (e.g., the processor 120 of FIG. 1) may correct (e.g., at operation 280 of FIG. 2) information dependent on a direction of the electronic device 101 among information stored in a data table (e.g., the data table 520 of FIGS. 5A to 5C). For example, information for outputting of different values according to the direction of the electronic device 101 at the time of measurement among information stored in the data table may be understood as information dependent on the direction of the electronic device 101. For example, magnetometer values (e.g., the magnetometer value 523 of FIGS. 5A to 5C) among information stored in the data table may output different values according to the direction of the electronic device 101 at the time of measurement, and the magnetometer values may be thus considered to be dependent on the direction of the electronic device 101.

According to various embodiments, the processor may perform correction using a reference direction and the direction of the electronic device 101 at the time of measuring a magnetometer value. According to various embodiments, the reference direction may refer to the direction of the electronic device 101 in a state where a guide area and the electronic device 101 are horizontal.

According to various embodiments, an operation of correcting a magnetometer value may include a first correction operation and a second correction operation.

A measurement area 660 described below may refer to a real area corresponding to a guide area (e.g., the guide area 410 of FIG. 4) displayed in augmented reality. A measurement spot 620 described below may refer to a specific spot in reality, which corresponds to a point (e.g., a point, such as, specific spot 420 of FIG. 4) displayed in the augmented reality. The measurement spot 620 may be defined as the foot of a perpendicular line dropped in the measurement area 660 from a specific spot (e.g., a central part of the electronic device or a part in which a camera is placed) of the electronic device. An opposing spot 630 described below may refer to a spot at which the opposite direction of the electronic device 101 and the measurement area 660 meet.

Referring to FIG. 6A, a first correction operation may be performed so that a direction of a second vector 631 passing through an opposing spot 630 at a selected spot (e.g., a central part of the electronic device or a part in which a camera is placed) of an electronic device 101 matches a direction of a first vector 621 passing through a measurement spot 620 at the selected spot (e.g., a central part of the electronic device or a part in which a camera is placed) of the electronic device 101. According to an embodiment, the opposing spot 630 is associated with a direction in which the electronic device 101 faces, and may be thus a spot dependent on the direction of the electronic device 101. Accordingly, the second vector 631 may refer to the direction of the electronic device 101 at the time of measuring a magnetometer value. Correcting the direction of the second vector 631 to match the direction of the first vector 621 may be correcting the electronic device 101 to be parallel to the measurement area 660. When a determinant for matching of the direction of the second vector 631 with the direction of the first vector 621 is applied to a magnetometer value, the magnetometer value may be corrected to a value measured in a state where the electronic device 101 is parallel to the measurement area 660.

Referring to FIG. 6B, a second correction operation may be performed so that a direction of a fourth vector 651 corresponding to an extension direction of an electronic device 101 (e.g., a vertical direction of an electronic device 101) matches a direction of a third vector 641 corresponding to one direction (e.g., a horizontal direction of a measurement area 660, and a X-axis direction of FIG. 6B) of the measurement area 660. Since the third vector 641 is determined according to the measurement area 660 and the fourth vector 651 is determined according to posture of the electronic device 101 at the time of measuring the magnetometer value, correction may be performed to match the direction of the fourth vector 651 to the direction of the third vector 641. When a determinant for matching of the fourth vector 651 to the third vector 641 is applied to a magnetometer value, the magnetometer value may be corrected to a value measured in a state where the extension direction of the electronic device 101 is parallel to one direction of the measurement area 660.

According to various embodiments, correction may be performed via the first correction operation in a state where the measurement area 660 and the electronic device 101 are parallel, and correction is performed via the second correction operation in a state where one direction of the measurement area 660 and the extension direction of the electronic device 101 are parallel. The direction of the electronic device 101 with respect to the measurement area 660 may be fixed via the first correction operation and the second correction operation. In this way, when the first correction operation and the second correction operation are performed, the magnetometer values stored in the data table (e.g., the data table 520 of FIGS. 5A to 5C) may be corrected so as to be substantially the same as those measured in a state where all directions of the electronic device 101 with respect to the measurement area 660 are the same. Accordingly, a magnetometer value which may vary depending on the direction at the time of measurement may be corrected to a value measured in the same direction.

According to various embodiments, the processor of the electronic device may use an acceleration value and a gyro value stored in the data table so as to correct a magnetometer value stored together in the data table. The acceleration value and the gyro value may refer to posture information of the electronic device moving in the measurement area 660. Therefore, the posture of the electronic device may be made to be the same with respect to the measurement area 660 by using the acceleration value and the gyro value, and the magnetometer value may be corrected accordingly. According to various embodiments, correction of a magnetometer value by using an acceleration value and a gyro value may be used to supplement the first correction operation and the second correction operation described above. For example, the first correction operation and the second correction operation may not be performed correctly due to an error in augmented reality coordinates. In this case, a magnetometer value may be corrected using posture information of the electronic device via an acceleration value and a gyro value.

Figure 7:
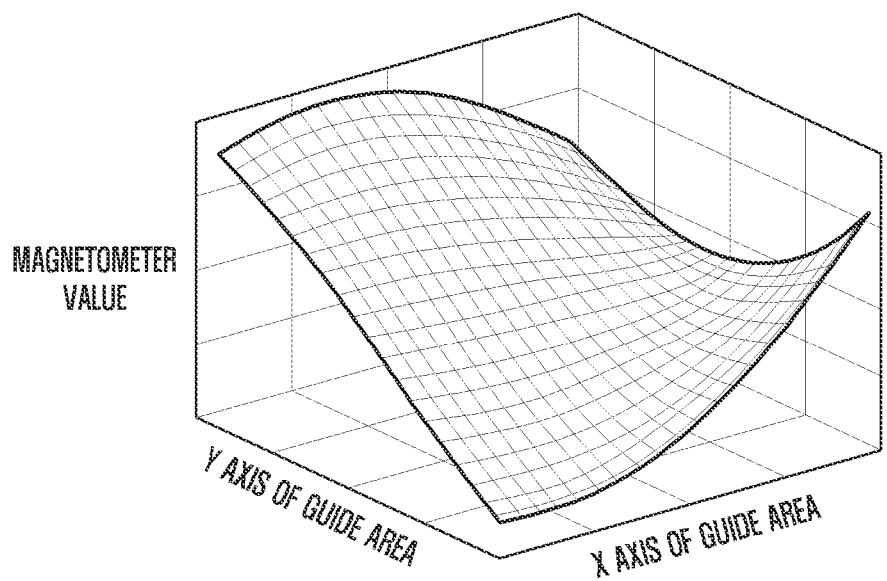
FIG. 7 is a graph illustrating magnetometer values as continuous data according to an embodiment of the disclosure.

FIG. 7 is a graph illustrating magnetometer values as continuous data according to an embodiment of the disclosure.

According to various embodiments, a processor (e.g., the processor 120 of FIG. 1) of an electronic device (e.g., the electronic device 101 of FIG. 1) may derive (e.g., at operation 290 of FIG. 2) magnetometer values between multiple blocks by using magnetometer values included in a data table (e.g., the data table 520 of FIGS. 5A to 5C) corresponding to the respective multiple blocks. For example, the processor may derive magnetometer values between adjacent blocks by processing the magnetometer values of adjacent blocks via a technique such as interpolation or curve fitting. Accordingly, as illustrated in FIG. 7, continuous magnetometer values within a guide area may be derived. The X and Y axes of a graph illustrated in FIG. 7 may refer to X and Y coordinates of a guide area, and a Z axis may refer to a magnetometer value (e.g., Mag_X of FIGS. 5A to 5C) in the X direction.

According to various embodiments, the processor may derive continuous magnetometer values within a guide area by using magnetometer values measured at multiple spots instead of magnetometer values stored in multiple corresponding data tables. Previously, it has been described that a representative value of magnetometer values is stored in a data table, but the processor may store, in a memory, magnetometer values measured at multiple spots and may derive continuous magnetometer values by using the magnetometer values stored in the memory.

Figure 8B:
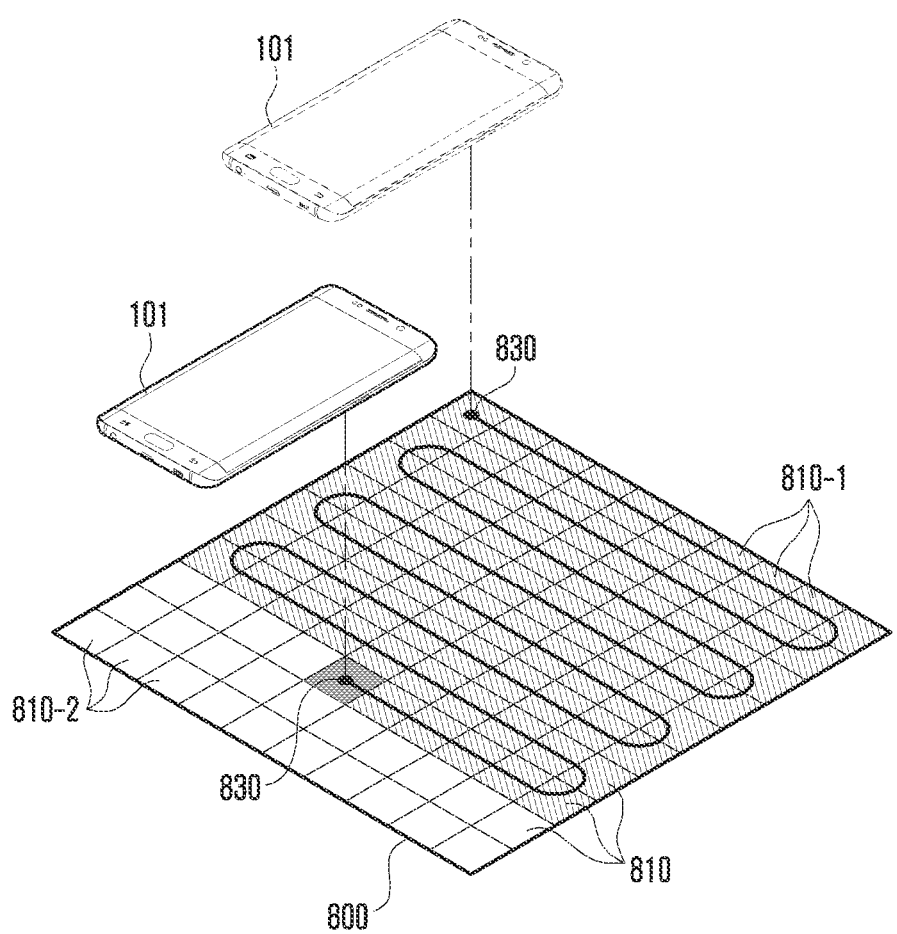

FIGS. 8A and 8B are diagrams for describing an operation of validating a magnetometer value according to various embodiments of the disclosure.

According to various embodiments, a processor (e.g., the processor 120 of FIG. 1) of an electronic device (e.g., the electronic device 101 of FIG. 1) may validate (e.g., at operation 300 of FIG. 2) a magnetometer value. Validation of a magnetometer value may be performed with respect to a magnetometer value measured while a point 830 is moving in a guide area 800, and may be performed after all magnetometer values are stored in the data table (e.g., the data table 520 of FIGS. 5A to 5C) matched to multiple blocks 810.

First, a method of verifying validity after all magnetometer values are stored will be described with reference to FIG. 8A.

Referring to FIG. 8A, for convenience of description, FIG. 8A is a graph showing coordinates of a two-dimensional guide area 800 on the X and Y axes and showing one (e.g., a magnetometer value of the X direction (e.g., Mag_X of FIG. 5A)) of magnetometer values in the X, Y, and Z directions on the Z axis. For example, if the number of inflection points of the graph is less than or equal to a configured number, the processor may determine that the graph is a simple graph so as to determine that the magnetometer value is invalid. (a) of FIG. 8A shows a graph of a more complex shape compared to part (b) of FIG. 8A, and it may be thus determined that part (a) of FIG. 8A is valid, and part (b) of FIG. 8A is invalid.

According to various embodiments, the processor may verify validity of magnetometer values by comparing magnetometer values measured in a measurement area corresponding to the current guide area 800 with magnetometer values measured in another measurement area. For example, validity may be verified by comparing similarity of a graph according to magnetometer values measured in the current measurement area and a graph according to magnetometer values measured in another measurement area. A graph according to magnetometer values may be, for example, a graph of the type illustrated in FIG. 7 or FIG. 8A. As another example, validity of magnetometer values may be verified by arranging magnetometer values measured in another measurement area and magnetometer values measured in the current measurement area in ascending order and then comparing differences thereof.

If a magnetometer value is determined not to be valid, the electronic device may notify a user in various ways that the magnetometer value needs to be re-measured. For example, words indicating that re-measurement is required may be displayed on a display (e.g., the display device 160 of FIG. 1) or a user may be notified of the need for re-measurement, by using vibration or sound.

Subsequently, a method of verifying validity of a magnetometer value measured while the point 830 is moving in the guide area 800 will be described with reference to FIG. 8B. In the case of FIG. 8B, the electronic device 101 is illustrated to be over the guide area 800 for convenience of explanation, but the guide area 800 and the point 830 are displayed in augmented reality and may be thus displayed on the display of the electronic device.

According to various embodiments, the processor may verify validity of a magnetometer value by comparing the magnetometer value with noise generated when a magnetometer sensor of the electronic device measures the magnetometer value. For example, if a difference in magnetometer values between adjacent blocks exceeds twice the noise, the magnetometer value may be determined not to be valid.

The above verification may be continuously performed with respect to the magnetometer value measured while the point 830 is moving the guide area 800. The electronic device may display a block 810-2, in which a magnetometer value determined to be invalid is measured, differently from a block 810-1 determined to be valid. For example, the electronic device may display the block 810-1 determined to be valid in green shade, and may display the block 810-2 determined to be invalid in red shade.

According to various embodiments disclosed in the document, a data table (e.g., the data table 520 of FIGS. 5A to 5C) including various information at multiple spots in a specific area may be generated. A specific area and a data table or a set of data tables generated in the specific area may be defined as virtual markers. A virtual marker may be used for indoor positioning. For example, the electronic device of the user may identify whether the electronic device is adjacent to a virtual marker, based on a radio signal intensity. In a case of being within a range configured by comparing a radio signal intensity stored in the virtual marker with a radio signal intensity of the current electronic device, the electronic device may determine that the corresponding virtual marker and the electronic device are adjacent. Subsequently, the electronic device may compare a magnetometer value measured by the magnetometer sensor with a magnetometer value stored in the virtual marker. If a change pattern of a magnetometer value according to movement of the electronic device matches a pattern of the magnetometer value stored in the virtual marker within a configured range, the electronic device may determine that the user has reached a point at which the virtual marker is generated.

According to various embodiments disclosed in the document, although not illustrated, the electronic device 101 may transmit a generated virtual marker to a server (e.g., the server 108 of FIG. 1) or another electronic device (e.g., the electronic device 102 of FIG. 1) through a communication module (e.g., the communication module 190 of FIG. 1). In an embodiment, the electronic device may receive and store a virtual marker generated by another electronic device or stored in the server, through the communication module. The electronic device may provide indoor positioning at a designated place by using the stored virtual marker. The method for providing indoor positioning according to various embodiments of the disclosure facilitates easy generation of a virtual marker via which whether a user has reached a specific point may be identified without additional equipment for indoor positioning.

Figure 9:
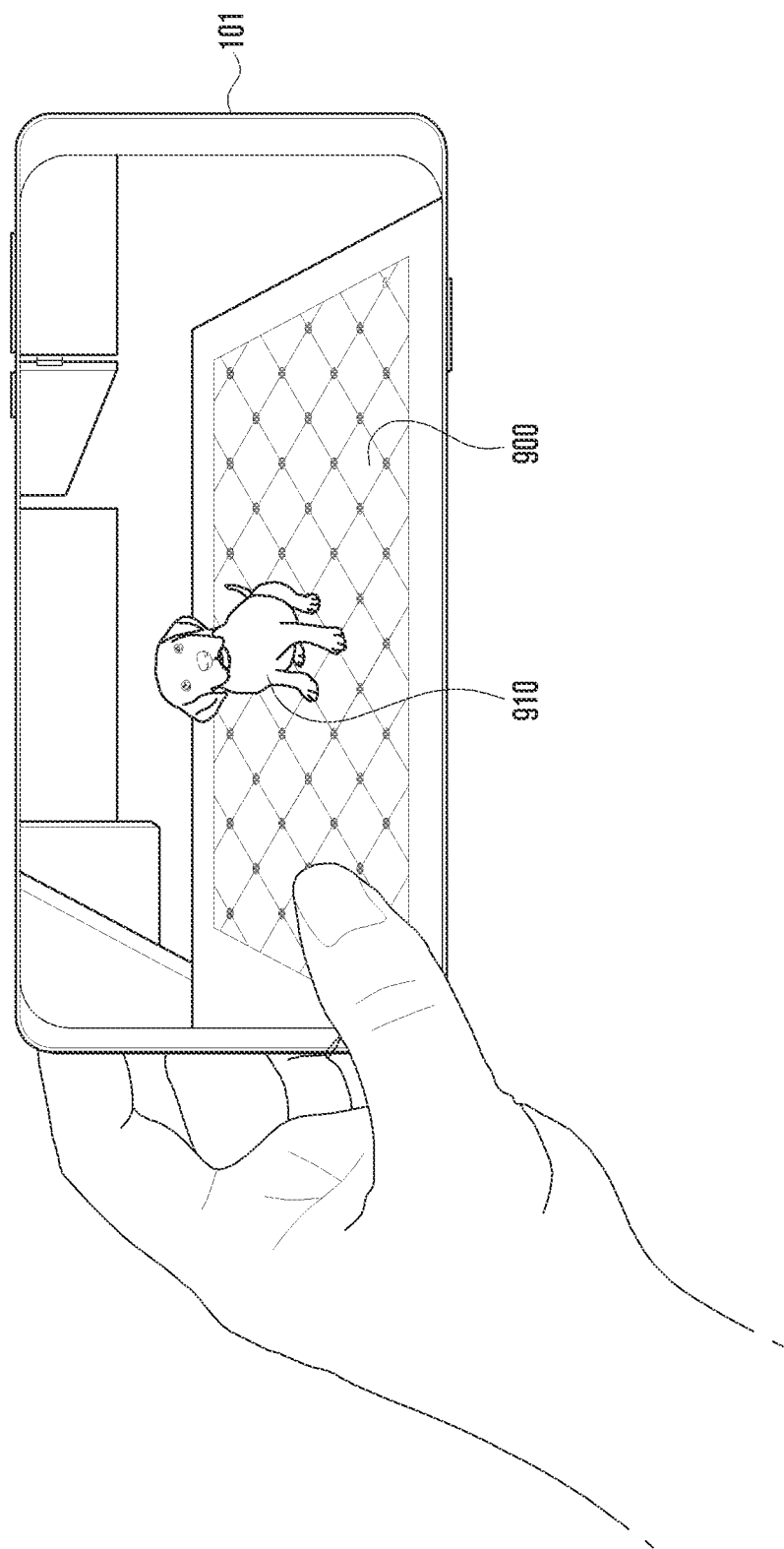
FIG. 9 is a diagram illustrating a virtual marker and an object displayed on the virtual marker according to an embodiment of the disclosure.

FIG. 9 is a diagram illustrating a virtual marker and an object displayed on the virtual marker according to an embodiment of the disclosure.

According to various embodiments, the electronic device 101 may match an image captured via a camera (e.g., the camera module 180 of FIG. 1) to a virtual marker and store the same while the virtual marker being generated. Later, during a procedure in which a user recognizes a virtual marker generated via augmented reality, a generation point of the virtual marker may be displayed in the augmented reality via image analysis.

According to various embodiments, a processor (e.g., the processor 120 of FIG. 1) may display a location of a virtual marker in augmented reality by using a configured UI 900. For example, the configured UI 900 may include a visual UI, such as a shadow, a color, or an arrow image. In an embodiment, when the electronic device 101 displays positions of multiple virtual markers in the augmented reality, the UI 900 configured to correspond to the respective positions of the multiple virtual markers may be displayed.

According to various embodiments, the processor may include object data in a virtual marker and store the same. An object 910 may be displayed in the augmented reality, which is displayed on the electronic device 101 of a user, by using object data stored in the virtual marker. The object may be, for example, an object, such as a signboard, a menu board, and a mascot which may display information of a store.

According to various embodiments, a virtual marker may be displayed in the augmented reality in various ways. For example, the processor may display a spot, at which a virtual marker exists in the augmented reality, by using at least one of the configured UI 900 and the object 910. In an embodiment, only the object 910 may be displayed at the spot corresponding to a position of the virtual marker. If multiple virtual markers exist, a specific virtual marker may not be displayed in the augmented reality. For example, a virtual marker positioned at the outermost part of an augmented reality screen may not be displayed.

According to various embodiments, the processor may receive a user input via at least one of the configured UI 900 and/or the object 910. For example, the processor may receive a user's touch input corresponding to the position of the object 910 and/or the configured UI 900 displayed on a display (e.g., the display device 160 of FIG. 1). When the user input is received, the processor may perform a function mapped to the virtual marker. For example, in a case where the object 910 (e.g., a coupon-shaped image) data is stored in a virtual marker at a position of a counter in a store, an operation of downloading a coupon of the store will be mapped to the virtual marker. When a user touches the coupon-shaped object in the augmented reality, the processor 120 may perform the operation of downloading a coupon usable in the store from a server (e.g., the server 108 of FIG. 1).

An electronic device according to various embodiments disclosed in the document may include a display, a camera, and a processor operatively connected to the display and the camera, wherein the processor is configured to display, based on an image captured by the camera, augmented reality on the display, display a point moving in the augmented reality on the display in association with movement of the electronic device, recognize a selected spot in the augmented reality, display a guide area including the selected spot in the augmented reality so that the point moves within a specific area, store sensor information including a magnetometer value measured while the point is moving within the guide area, store radio signal intensity information measured while the point is moving within the guide area, and correct the magnetometer value included in the sensor information by using a reference direction and a direction of the electronic device at a point in time when the magnetometer value is measured.

The processor may divide the guide area into multiple blocks, may match sensor information, which includes magnetometer values measured in blocks through which the point passes while the point is moving within the guide area, to the corresponding blocks so as to store the same, and may store radio signal intensity information measured in at least one of the multiple blocks through which the point passes while the point is moving within the guide area.

The processor may derive magnetometer values between the multiple blocks by using the magnetometer values corresponding to the multiple blocks so that the magnetometer values become continuous data within the guide area.

The processor may verify validity of the magnetometer values included in the sensor information, and may request re-measurement of the sensor information, based on the validity of the magnetometer values.

The processor may verify the validity of the magnetometer values by comparing the magnetometer values with magnetometer values measured in a guide area other than the guide area.

The processor may verify the validity of the magnetometer values by comparing the magnetometer values with noise generated when the magnetometer values are measured.

The processor may verify the validity of the magnetometer values, based on a graph shape of the magnetometer values corresponding to the multiple blocks.

The reference direction may refer to a direction of the electronic device in a state where the electronic device is horizontal with respect to a measurement area corresponding to the guide area.

The correcting of the magnetometer value, which is performed by the processor, may include a first correction and a second correction, wherein the first correction may be performed so that a direction that the electronic device faces during measurement of the magnetometer value matches a direction of a vector passing vertically through the measurement area at a specific spot of the electronic device, and the second correction may be performed so that an extension direction of the electronic device during measurement of the magnetometer value matches one direction of the measurement area.

The sensor information may further include an acceleration value measured by an acceleration sensor of the electronic device and a gyro value measured by a gyro sensor of the electronic device.

A method for providing indoor positioning according to various embodiments of the document may include displaying a point moving in augmented reality in association with movement of an electronic device, recognizing a selected spot in the augmented reality, displaying a guide area, which includes the selected spot, in the augmented reality so that the point moves within a specific area, storing sensor information including a magnetometer value measured in a block through which the point passes while the point is moving within the guide area, storing radio signal intensity information measured while the point is moving within the guide area, and correcting the magnetometer value included in the sensor information by using a reference direction and a direction of the electronic device at a point in time when the magnetometer value is measured.

The method may further include dividing the guide area into multiple blocks, and the storing of the sensor information may include matching sensor information, which includes magnetometer values measured in blocks through which the point passes while the point is moving within the guide area, to the corresponding blocks so as to store the same, and the storing of the radio signal intensity information may include storing radio signal intensity information measured in at least one of the blocks through which the point passes while the point is moving within the guide area.

The method may further include deriving magnetometer values between the multiple blocks by using the magnetometer values corresponding to the multiple blocks so that the magnetometer values become continuous data within the guide area.

The method may further include verifying validity of the magnetometer values corresponding to the multiple blocks, and requesting re-measurement of the sensor information, based on the validity of the magnetometer values.

The verifying of the validity of the magnetometer values may be performed by comparing the magnetometer values with magnetometer values measured in a guide area other than the guide area.

The verifying of the validity of the magnetometer values may be performed by comparing the magnetometer values with noise generated when the magnetometer values are measured.

The verifying of the validity of the magnetometer values may be performed based on a graph shape of the magnetometer values corresponding to the multiple blocks.

In the correcting of the magnetometer value, the reference direction may refer to a direction of the electronic device in a state where the electronic device is horizontal with respect to a measurement area corresponding to the guide area.

The correcting of the magnetometer value may include a first correction and a second correction, wherein the first correction may be performed so that a direction that the electronic device faces during measurement of the magnetometer value matches a direction of a vector passing vertically through the measurement area at a specific spot of the electronic device, and the second correction may be performed so that an extension direction of the electronic device during measurement of the magnetometer value matches one direction of the measurement area.

The sensor information may further include an acceleration value measured by an acceleration sensor of the electronic device and a gyro value measured by a gyro sensor of the electronic device.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:
1. An electronic device comprising:
a display;
a camera; and one or more processors communicatively connected to the display and the camera, memory storing one or more computer programs including computer-executable instructions that, when executed by the one or more processors, cause the electronic device to:

display, based on an image captured by the camera, augmented reality screen on the display, display a point in the augmented reality screen on the display, the point moving in association with movement of the electronic device, identify a spot selected by a user input in the augmented reality screen, display a guide area comprising the selected spot in the augmented reality screen, store sensor information comprising a magnetometer value measured while the point is moving within the guide area, store radio signal intensity information measured while the point is moving within the guide area, and correct the magnetometer value included in the sensor information by using a reference direction and a direction of the electronic device at a point in time when the magnetometer value is measured, and wherein the point corresponds to a measurement spot where a line extending in a direction perpendicular to a real area corresponding to the guide area from a specific spot of the electronic device meets the real area.

2. The electronic device of claim 1, wherein the one or more computer programs further comprise computer-executable instructions to:

divide the guide area into multiple blocks;

match sensor information, which comprises magnetometer values measured in blocks through which the point passes while the point is moving within the guide area, to corresponding blocks so as to store the same; and store radio signal intensity information measured in at least one of the multiple blocks through which the point passes while the point is moving within the guide area.

3. The electronic device of claim 2, wherein the one or more computer programs further comprise computer-executable instructions to derive magnetometer values between the multiple blocks by using the magnetometer values corresponding to the multiple blocks so that the magnetometer values become continuous data within the guide area.

4. The electronic device of claim 2, wherein the one or more computer programs further comprise computer-executable instructions to:

verify validity of the magnetometer values included in the sensor information; and request re-measurement of the sensor information, based on the validity of the magnetometer values.

5. The electronic device of claim 4, wherein the one or more computer programs further comprise computer-executable instructions to verify the validity of the magnetometer values by comparing the magnetometer values with magnetometer values measured in another guide area other than the guide area.

6. The electronic device of claim 4, wherein the one or more computer programs further comprise computer-executable instructions to verify the validity of the magnetometer values by comparing the magnetometer values with noise generated when the magnetometer values are measured.

7. The electronic device of claim 4, wherein the one or more computer programs further comprise computer-executable instructions to verify the validity of the magnetometer values, based on a graph shape of the magnetometer values corresponding to the multiple blocks.

8. The electronic device of claim 1, wherein the reference direction refers to a direction of the electronic device in a state where the electronic device is horizontal with respect to the real area corresponding to the guide area.

9. The electronic device of claim 8, wherein the correcting of the magnetometer value, which is performed by the processor, comprises a first correction and a second correction, wherein the first correction is performed so that a direction that the electronic device faces during measurement of the magnetometer value matches a direction of a vector passing vertically through the real area at a specific spot of the electronic device, and wherein the second correction is performed so that an extension direction of the electronic device during measurement of the magnetometer value matches one direction of the real area.

10. The electronic device of claim 1, wherein the sensor information further comprises an acceleration value measured by an acceleration sensor of the electronic device and a gyro value measured by a gyro sensor of the electronic device.

11. A method for providing indoor positioning, the method comprising:

displaying a point in augmented reality screen, the point moving in association with movement of an electronic device;

identifying a spot selected by a user input in the augmented reality screen;

displaying a guide area, which comprises the selected spot, in the augmented reality screen;

storing sensor information comprising a magnetometer value measured in a block through which the point passes while the point is moving within the guide area;

storing radio signal intensity information measured while the point is moving within the guide area; and correcting the magnetometer value included in the sensor information by using a reference direction and a direction of the electronic device at a point in time when the magnetometer value is measured, wherein the point corresponds to a measurement spot where a line extending in a direction perpendicular to a real area corresponding to the guide area from a specific spot of the electronic device meets the real area.

12. The method of claim 11, further comprising:

dividing the guide area into multiple blocks, wherein the storing of the sensor information comprises matching sensor information, which comprises magnetometer values measured in blocks through which the point passes while the point is moving within the guide area, to corresponding blocks so as to store the same, and wherein the storing of the radio signal intensity information comprises storing radio signal intensity information measured in at least one of the blocks through which the point passes while the point is moving within the guide area.

13. The method of claim 12, further comprising:

deriving magnetometer values between the multiple blocks by using the magnetometer values corresponding to the multiple blocks so that the magnetometer values become continuous data within the guide area.

14. The method of claim 12, further comprising:
verifying validity of the magnetometer values corresponding to the multiple blocks; and
requesting re-measurement of the sensor information, based on the validity of the magnetometer values.

15. The method of claim 14, wherein the verifying of the validity of the magnetometer values is performed by comparing the magnetometer values with magnetometer values measured in another guide area other than the guide area.

16. The method of claim 14, wherein the verifying of the validity of the magnetometer values is performed by comparing the magnetometer values with noise generated when the magnetometer values are measured.

17. The method of claim 14, wherein the verifying of the validity of the magnetometer values is performed based on a graph shape of the magnetometer values corresponding to the multiple blocks.

18. The method of claim 11, wherein in the correcting of the magnetometer value, the reference direction refers to a direction of the electronic device in a state where the electronic device is horizontal with respect to the real area corresponding to the guide area.

19. The method of claim 18,
wherein the correcting of the magnetometer value comprises a first correction and a second correction,
wherein the first correction is performed so that a direction that the electronic device faces during measurement of the magnetometer value matches a direction of a vector passing vertically through the real area at a specific spot of the electronic device, and
wherein the second correction is performed so that an extension direction of the electronic device during measurement of the magnetometer value matches one direction of the real area.

20. The method of claim 11, wherein the sensor information further comprises an acceleration value measured by an acceleration sensor of the electronic device and a gyro value measured by a gyro sensor of the electronic device.

* * * * *